(12) United States Patent
Schlenga et al.

(10) Patent No.: US 8,283,293 B2
(45) Date of Patent: Oct. 9, 2012

(54) METHOD FOR PRODUCING A HTS COATED CONDUCTOR AND HTS COATED CONDUCTOR WITH REDUCED LOSSES

(75) Inventors: Klaus Schlenga, Linkenheim (DE); Alexander Usoskin, Hanau (DE)

(73) Assignee: Bruker HTS GmbH, Hanau (DE)

( * ) Notice: Subject to any disclaimer, the term of this patent is extended or adjusted under 35 U.S.C. 154(b) by 0 days.

(21) Appl. No.: 13/137,040

(22) Filed: Jul. 18, 2011

(65) Prior Publication Data

US 2012/0015818 A1   Jan. 19, 2012

(30) Foreign Application Priority Data

Jul. 19, 2010   (EP) .................................... 10170032

(51) Int. Cl.
*H01L 39/24*   (2006.01)
(52) U.S. Cl. ......................... 505/237; 427/62
(58) Field of Classification Search .............. 505/230, 505/237, 238, 430, 434, 470; 428/699–701, 428/930; 427/62
See application file for complete search history.

(56) References Cited

U.S. PATENT DOCUMENTS

| 7,491,678 B2 | 2/2009 | Crisan |
| 7,642,222 B1 | 1/2010 | Wang |

FOREIGN PATENT DOCUMENTS

| EP | 0 488 717 | 6/1992 |
| EP | 1 777 324 | 4/2007 |

OTHER PUBLICATIONS

Sung Hun Wee et al., "Growth of Thick-Doped Films With High Critical Currents in High Applied Magnetic Fields", IEEE Transactions on Applied Superconductivity, IEEE Service Center, Los Alamitos, CA, US, vol. 19, No. 3, Jun. 1, 2009, pp. 3266-3269.

Sun Hun Wee et al., "Rapid Communication; High performance superconducting wire in high applied magnetic fields via nanoscale defect engineering", Superconductor Science and Technology, IOP Publishing, Techno House, Bristol, GB, vol. 21, No. 9, Sep. 1, 2008, p. 92001.

Kimura et al., "Superconducting properties of EuBa2Cu3O7 thin films on thick Sm2O3 buffer layers", Physica C, North-Holland Publishing, Amsterdam, NL, vol. 463-465, Sep. 8, 2007, pp. 914-917.

*Primary Examiner* — Colleen Dunn
(74) *Attorney, Agent, or Firm* — Paul Vincent (57) ABSTRACT

A method for producing a high temperature superconductor (=HTS) coated conductor (12), wherein a buffer layer (2; 22) and an HTS layer (4; 24; 65) are deposited on a substrate (1; 21), with the following steps: a) after depositing the buffer layer (2; 22), the surface (2a) is locally roughened, resulting in a roughened surface (13), b) a non-superconducting, closed intermediate layer (3; 23) is deposited on top of the roughened surface (13), c) and the HTS layer (4; 24; 65) is deposited on top of the intermediate layer (3; 23). A simple method for producing a HTS coated conductor with reduced losses, and with improved critical current and critical magnetic field is thereby provided.

21 Claims, 7 Drawing Sheets

METHOD FOR PRODUCING A HTS COATED CONDUCTOR AND HTS COATED CONDUCTOR WITH REDUCED LOSSES

This application claims Paris Convention priority of EP 10 170 032.6 filed Jul. 19, 2010 the complete disclosure of which is hereby incorporated by reference.

BACKGROUND OF THE INVENTION

The invention relates to a method for producing a high temperature superconductor (=HTS) coated conductor, wherein a buffer layer and an HTS layer are deposited on a substrate.

Such a method is known from U.S. Pat. No. 7,491,678 B2.

Superconductors are used to transport electrical current at low resistance, and thus at low power losses. Superconductors require cryogenic cooling in order to assure the superconducting state. High temperature superconductor (=HTS) materials have a relatively high critical temperature $T_c$, as compared to conventional superconductors, and therefore are less expensive in cooling. In particular, some HTS materials allow the use of liquid nitrogen for cooling. On the other hand, the HTS materials exhibit rather high critical current densities at low temperatures of 3 to 20K. This performance is important for high field magnets used in e.g. NMR where fields are so high that the current performance of low temperature superconductors (typically used in this area) becomes insufficient.

Known HTS materials are ceramic, and may be (and typically are) prepared as thin films on a substrate for practical applications ("coated conductor type"). Generally, in order to achieve a high current carrying capacity, the thin HTS films should be highly textured, practically single crystalline, with a defect density as small as possible. It is known to use buffer layers between a substrate and a HTS thin film in order to provide the crystalline structure of the thin HTS film, or to improve the crystal quality of the thin HTS film.

However, in the regime of use of HTS materials, the HTS materials act as type II superconductors, meaning that magnetic flux may penetrate into a HTS layer, typically as isolated "flux pipes" (in German "Flussschläuche"). The density and position of the flux pipes depends on the magnetic field present (which may be an external field and/or a field originating from the electrical current running through the HTS layer, "self field"). During use of the HTS coated conductor, the magnetic field typically varies, and the flux pipes redistribute accordingly. This redistribution or movement of the flux pipes causes electrical losses, and may decrease the critical current and the critical magnetic field of the HTS coated conductor at which the HTS material quenches (i.e. becomes normally conducting).

It is known that "pinning centers" may reduce losses and increase the critical current and the critical magnetic field in a type II superconductor. The pinning centers make the flux pipes stay at the pinning centers when the magnetic field varies.

U.S. Pat. No. 7,491,678 B2 proposes to deposit insularly nano dots, typically made of Ag, Mg or Zn, on a flat, buffered substrate surface, and then to deposit a HTS film on top of the buffered substrate surface provided with the nano dots. The HTS film grows with columnar defects above the nano dots, and the columnar defects act as pinning centers for the magnetic flux. However, the nano dots may easily introduce more defects into the HTS film than desired, what decreases the critical current and the critical magnetic field again.

U.S. Pat. No. 7,642,222 B1 describes a cubic oxide material substrate equipped with a buffer layer of rocksalt type including particulate outgrowths, resulting in a rough surface morphology of the buffer layer. The HTS film is grown of top, wherein the particulate outgrowths serve as pinning centers. In this method, the surface morphology of the buffer layer is difficult to control, and extended defects are introduced into the HTS film, what limits the positive effect of the pinning centers again.

It is the object of present invention to provide a simple method for producing a HTS coated conductor with reduced losses, and with improved critical current and critical magnetic field.

SUMMARY OF THE INVENTION

This object is achieved, in accordance with the invention, by a method for producing a high temperature superconductor (=HTS) coated conductor, wherein a buffer layer and an HTS layer are deposited on a substrate, with the following steps:

a) after depositing the buffer layer, the surface is locally roughened, resulting in a roughened surface, b) a non-superconducting, closed intermediate layer is deposited on top of the roughened surface, c) and the HTS layer is deposited on top of the intermediate layer.

In accordance with the invention, pinning centers are introduced by a particular preparation of the buffer layer after its deposition. The buffer layer is basically flat after deposition, typically with a surface roughness of less than 1 nm. Then, in accordance with the invention, a roughening step is performed. This roughening may involve locally removing material, or locally depositing material (which is typically not identical with the material of the buffer layer), and results in a structured surface ("roughened surface"). The roughening increases the surface roughness significantly (typically by a factor of at least 2, preferably by at least 10), as compared to the buffer layer as deposited.

Following this roughening, a closed intermediate layer is deposited on top of the structured surface. By this means, a defined surface for the deposition of the HTS layer is provided, so that the defect density and the pinning centers in the a HTS layer can be well controlled. In particular, after deposition of the intermediate layer, only one type of material is exhibited to the HTS layer, so the deposition (in particular epitaxial deposition) of the HTS material is fairly simple. Further, steep flanks or the roughened surface are somewhat smoothened by the intermediate layer.

Due to the underlying roughened surface, the intermediate layer surface is wavy. The HTS layer deposited on top of the intermediate layer will grow oriented with respect to the local surface of the intermediate layer, what results in local out of plane misorientation (typically the c-axis is not perpendicular to the substrate plane) of the HTS layer in areas where the intermediate layer is not parallel to the substrate plane. The interfaces of misoriented ("tilted") and correctly oriented ("in plane") HTS grains provide defects, which enhance the pinning of the magnetic flux.

The intermediate layer can be called a "second" buffer layer, since the HTS layer is deposited on this intermediate layer and which thus acts as a moderator between the HTS layer and the structures below. The intermediate layer is typically of the same material as the buffer layer (typically $CeO_2$, further referred to as CeO).

In accordance with the invention, a HTS material has a critical temperature $T_c$ of 40 K or higher, preferably 85 K or higher.

In a highly preferred variant of the inventive method, in step a), a first part of the surface area remains flat, and a second part of the surface area is provided with roughening structures, in particular recesses, such as scratches, dents or grooves, and/or protrusions, such as humps, islands, walls or ridges. In other words, during roughening, the first part remains unaffected, and the second part is worked on. This simplifies the surface roughening procedure. Note that the roughening structures may be randomly distributed, or systematically arranged (typically periodically arranged).

In an advantageous further development of this variant, the first part of the surface area remaining flat is at least 80%, preferably at least 95%, and the second part of the surface area provided with roughening structures is less than 20%, preferably less than 5% of the total surface area of the buffer layer. This minimizes the processing efforts. The flat surface of the buffer layer after deposition provides—at the mediation of the intermediate layer—the basis for the main part of the HTS film, which can be kept low in defect density.

Also preferred is a further development wherein the roughening structures are spaced apart by between 5 nm and 200 nm on average. Typically, the roughening structures have an effective diameter or width (in parallel to the substrate plane) of about between 1 nm to 50 nm, preferably between 2 nm and 10 nm. The average transverse size (perpendicular to the substrate plane) of the roughening structures is typically between 2 nm and 50 nm, preferably between 5 nm and 30 nm.

In a highly preferred variant of the inventive method, in step a), the roughening of the surface includes locally removing buffer layer material such that in the respective areas, the thickness if the buffer layer is reduced. This procedure is simple and compatible with all buffer layer materials.

A preferred further development of this variant provides that the removing of the buffer layer material includes mechanical scratching and/or etching, in particular selective ion beam etching or laser beam etching. The scratching is particularly simple and may be done in the course of a polishing procedure or another mechanical treatment procedure of the buffer layer. Laser beam etching avoids contamination and may include the interference of two or even more laser beams (or parts of a laser beam) for etching, allowing the generation of periodic etching structures.

In another highly preferred variant of the inventive method, in step a), the roughening of the surface includes placing local deposits on top of the buffer layer. In other words, the roughening structures are formed by locally depositing material on the buffer layer surface. Typically, the local deposits are of insular type ("islands"). Material deposition can easily be integrated in the HTS coated conductor production process.

Preferably, in a further development, the material of the local deposits is different from the material of the buffer layer. This simplifies the formation of self-assembled, regular roughening structures. The local deposits may be, for example, of metal material, in particular Pt, Mo or W, or high temperature dielectrics such as high melting temperature oxides or nitrides ($Cr_2O_3$, $Al_2O_3$, $Ti_xN$, $Si_3N_4$, $Ta_2O_5$, etc).

Another further development provides that the material of the local deposits is different from the material of the intermediate layer. This is advantageous with respect to the effects caused by minimizing of surface energy, in particular when the buffer layer material and the intermediate layer material are identical. Note that in some cases, though, the material of the intermediate layer and the material of the local deposits may have the same stoichiometry.

In a preferred further development, the local deposits are formed as a result of diffusion, in particular surface diffusion that consequences in island growth, during or after their deposition process. In this case, self assembling can be applied to space and/or size the local deposits. In particular, periodic roughening structures can easily be formed by self assembly.

Alternatively, in a further development, the local deposits are placed via depositing particles on the surface of the buffer layer directly. In this case, the wetting behavior will not affect the formation of the local deposits, what improves the control over the deposition process.

Also preferred is a variant wherein the intermediate layer material and the HTS layer material have basically the same stoichiometry. Then the deposition process for the intermediate layer and the HTS layer can be simplified, in particular using the same target or material source (when e.g. applying pulsed laser deposition). Note that the deposition parameters are altered between the deposition of the intermediate layer and the HTS layer, in order to achieve a non-superconducting phase/structure as intermediate layer (such as an amorphous phase) and a superconducting phase/structure as HTS layer.

Alternatively, the intermediate layer and the HTS layer are of different stoichiometry (for example CeO as intermediate layer and ReBCO as HTS layer).

Particularly advantageous is a variant wherein step a) is performed such that the roughened surface has a one- or two-dimensional periodicity. In other words, in step a), roughening structures are provided with a one- or two-dimensional periodicity. The periodicity of the roughened surface results in a periodic arrangement of the flux pipes during operation, allowing a highly efficient use of the area of the HTS coated conductor when distributing the flux pipes, and thus leading to particularly high critical currents and critical magnetic fields. Note that when applying/depositing further roughening steps, further intermediate layers and further HTS layers, a periodicity also with respect to the off-plane direction (perpendicular to the substrate plane) may be established, so even a 3D periodicity may be achieved.

A preferred variant of the inventive method provides that step a) is performed such that the surface roughness of the roughened surface is between 1 nm and 500 nm, preferably between 2 nm and 30 nm. Typically, said roughness is 2 nm or larger, and in most cases 5 nm or larger. These ranges of surface roughness give good results for most buffer layer materials and HIS materials.

Particularly preferred is a variant wherein d) after depositing the HTS layer, the surface is roughened, resulting in a further roughened surface, e) a non-superconducting, closed further intermediate layer is deposited on top of the further roughened surface, f) and a further HIS layer is deposited on top of the further intermediate layer, in particular wherein steps d) through f) are repeated at least once. In this variant, one or a plurality of sets of a further intermediate layer and a further HTS layer are deposited, in order to achieve a higher overall HTS material thickness in the coated conductor. Since the effect of a roughened surface fades with increasing thickness of the HTS layer, the surface roughening is repeated here. Preferably, the roughening structures and further roughening structures are periodic perpendicular to the substrate plane, such that the pinning centers of the different sets coincide for flux pipes running perpendicular to the substrate plane. The roughening in step d) may be done analogously to step a). The further intermediate layer and the further HTS layer may be deposited analogously as the intermediate layer and the HTS layer in steps b) and c). Note that a set of a further intermediate layer and a further HTS layer typically has a common thickness of between 5 nm and 200 nm, preferably of about 50 nm.

Also within the scope of the present invention is a HTS coated conductor, in particular produced by an inventive method as described above, comprising
a substrate,
a buffer layer deposited on top of the substrate, in particular of CeO, exhibiting a roughened surface,
a non-superconducting, closed intermediate layer, in particular of CeO, deposited on top of the roughened surface,
a HTS layer, in particular of ReBCO type, deposited on top of the intermediate layer. The inventive HTS coated conductor may achieve improved critical current densities and critical magnetic fields, and reduced losses. Note that the substrate may be, for example, of a stainless steel (in particular tape-type stainless steel), Hastelloy, a NiW alloy such as RABiTS, a dielectric such as sapphire or $SrTiO_3$, and many more. The HTS layer is typically of ReBCO material, with Re: a rare earth element (preferably Yttrium) or a combination of rare earth elements.

An advantageous embodiment of the inventive HIS coated conductor provides that the HTS coated conductor further comprises
a non-superconducting, closed further intermediate layer, in particular of CeO, deposited on top of the HIS layer which exhibits a further roughened surface,
and a further HTS layer, in particular of ReBCO type, deposited on top of the further intermediate layer,
in particular wherein one or more additional sets of further intermediate layers and further HTS layers follow. In each set, pinning centers may be introduced in a controlled way. An increased current carrying capacity may be achieved.

In another preferred embodiment, the roughened surface and/or one or a plurality of further roughened surfaces comprise recesses and/or protrusions, in particular protrusions of local deposits. Note that the local deposits may be of different material as compared to the buffer layer material and/or further intermediate layer material.

Within the scope of the present invention is further the use of an inventive HTS coated conductor as described above, wherein an electric current is transported through the HTS layer and/or one or a plurality of further HTS layers in a superconducting state, and wherein magnetic flux lines are pinned at roughening structures of the roughened surface and/or of one or a plurality of further roughened surfaces. The pinning results in less redistribution of the magnetic flux pipes, and thus less losses and improved (increased) critical current in high (3T-30T) magnetic fields and improved (increased) critical magnetic field itself.

Further advantages can be extracted from the description and the enclosed drawing. The features mentioned above and below can be used in accordance with the invention either individually or collectively in any combination. The embodiments mentioned are not to be understood as exhaustive enumeration but rather have exemplary character for the description of the invention.

The invention is shown in the drawing.

DESCRIPTION OF THE PREFERRED EMBODIMENT

Figure 1:
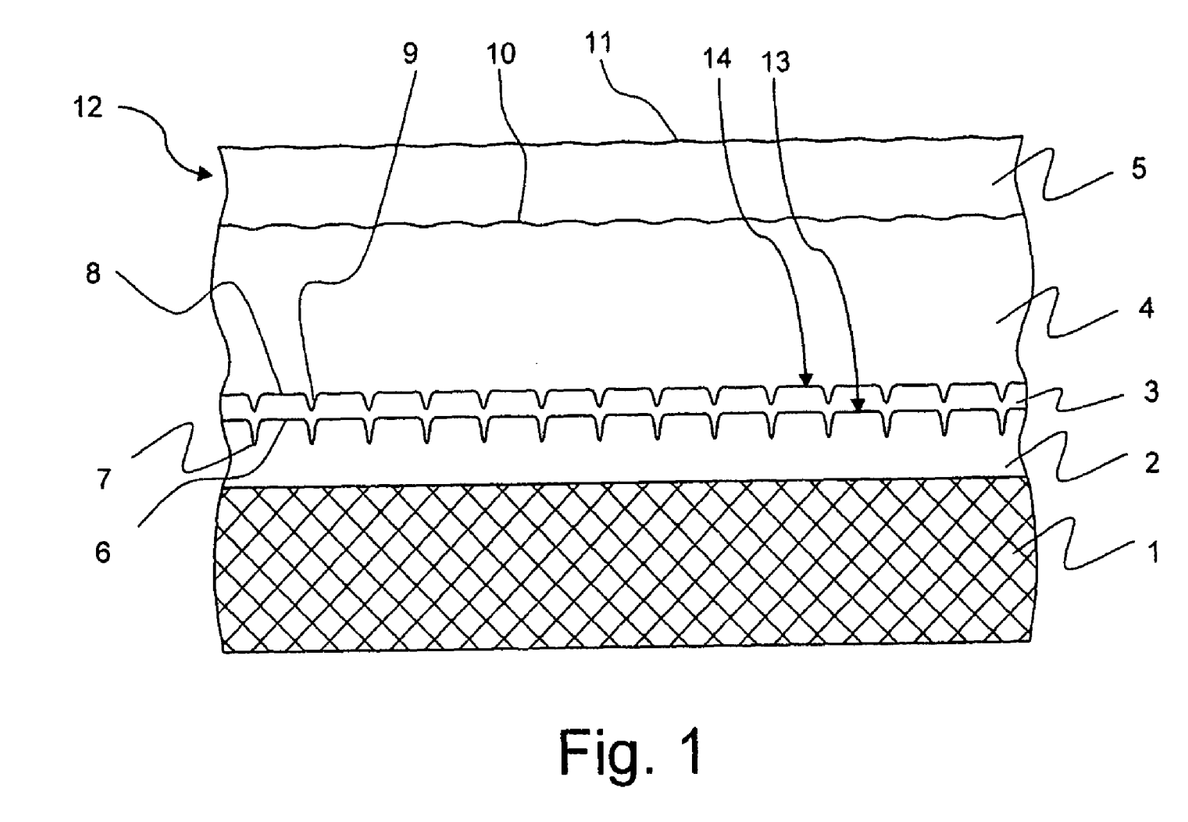
FIG. 1 shows a schematic cross-sectional view of a first embodiment of an inventive HTS coated conductor, with grooves as roughening structures.

FIG. 1 illustrates in a schematic cross-sectional view an inventive HTS coated conductor 12. It should be noted that all the figures are not to scale, and in particular show details exaggerated in the direction perpendicular to the substrate plane.

The HTS coated conductor 12 comprises a basically flat substrate 1, for example a steel tape. On top of the substrate 1, a basically flat buffer layer 2, for example of CeO, has been deposited. The buffer layer 2 typically has a thickness of between 300 nm and 1000 nm. The surface 13 of the buffer layer 2 has been roughened, here by locally removing buffer layer material, resulting in groove type roughening structures 7 at which the thickness (perpendicular to the substrate plane) of the buffer layer 2 is reduced. Between the roughening structures 7, there are unmachined flat surface areas 6. In the example shown, the roughening structures 7 are periodic along the substrate plane (note that periodicity is preferred, but not necessary, in accordance with the invention).

The roughened surface 13 is covered with a closed intermediate layer 3 of basically uniform thickness. The surface 14 of the intermediate layer 3 therefore imitates the roughened surface 13, including reproduced roughening structures 9 and reproduced flat areas 8. Note that the reproduced roughening structures 9 are somewhat smoothened as compared to the roughening structures 7, though. The intermediate layer 3 is typically of the same material as the buffer layer 2, here of CeO, and in particular is not superconducting (at the operating temperature of the HTS coated conductor 12). The intermediate layer 3 has typically a thickness of about 3 nm and 15 nm.

On top of the intermediate layer 3, a HTS layer 4, here of YBCO material, has been deposited. The growth of the HTS layer 4 above the reproduced roughening structures 9 introduces misorientation as compared to the growth above the reproduced flat areas 8, resulting in the provision of pinning centers in the HTS layer 4. The HTS layer 4 typically has a thickness of between 500 nm and 10 μm. The HTS layer 4 carries the electric current in a superconducting state at the operating temperature of the HTS coated conductor 12, which is typically at about 77 K but in high magnetic field (of 10 to 30T) applications may be lowered to 4.2 K and even lower in order to achieve critical current densities of 2000 $A/mm^2$ and even more.

The top surface 10 of the HTS layer 4 has retained some waviness, but to a much lower extent as compared to the roughened surface 13. On top of the HTS layer 4, a shunt layer 5 of a well conducting metal or metal alloy (such as Ag) has been deposited. At its surface 11, the waviness is further reduced.

Figure 2:
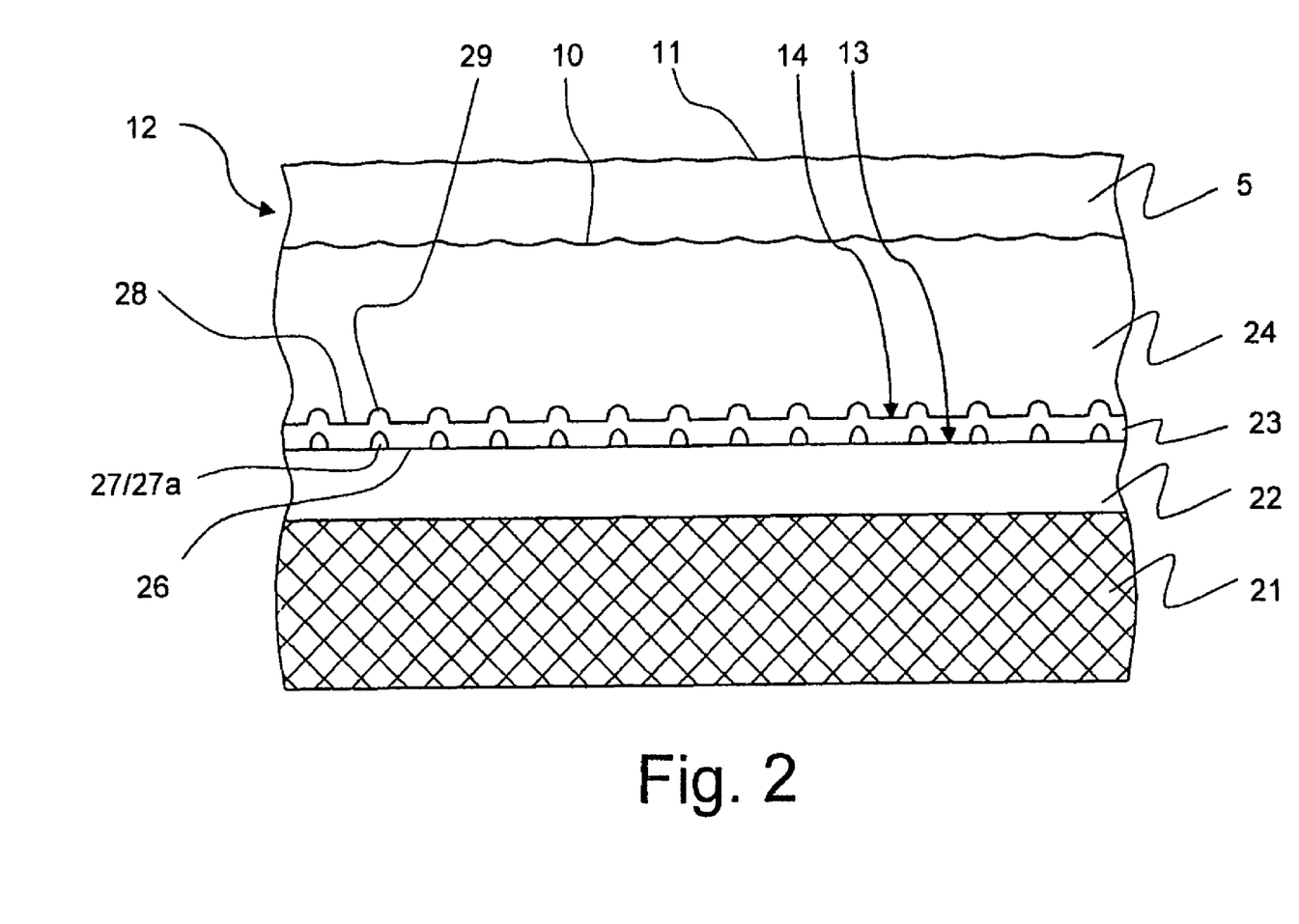
FIG. 2 shows a schematic cross-sectional view of a second embodiment of an inventive HTS coated conductor, with local deposits as roughening structures.

FIG. 2 shows a second embodiment of an inventive HTS coated conductor 12. For simplification, only the differences as compared to FIG. 1 are explained in detail.

On the basically flat substrate 21, a basically flat buffer layer 22 has been deposited. In order to obtain a roughened surface 13, roughening structures 27 of local deposit type (here resembling islands or humps) have been placed on the buffer layer surface. The material of the local deposits 27a is Pt, for example, deposited via vacuum cluster deposition technique using a Knudsen evaporation cell. Between the local deposits 27a, flat surface area 26 remains.

On top of the roughened surface 13 (including the local deposits 27a), a closed intermediate layer 23 has been deposited. Its surface 14 imitates the roughened surface 13, exhibiting hump like reproduced roughening structures 29 and reproduced flat areas 28. Note that the aspect ratio of the reproduced roughening structures 29 is somewhat lower as compared to the roughening structures 27.

On top of the closed intermediate layer 23, a HTS layer 24 has been deposited. On top of that, a shunt layer 5 has been deposited. Note that the waviness of the surfaces 10 and 11 of the HTS layer 24 and the shunt layer 5 are smaller as compared to the surface 14 of the intermediate layer 23, due to the larger distance from the roughened surface 13.

Figure 3A:
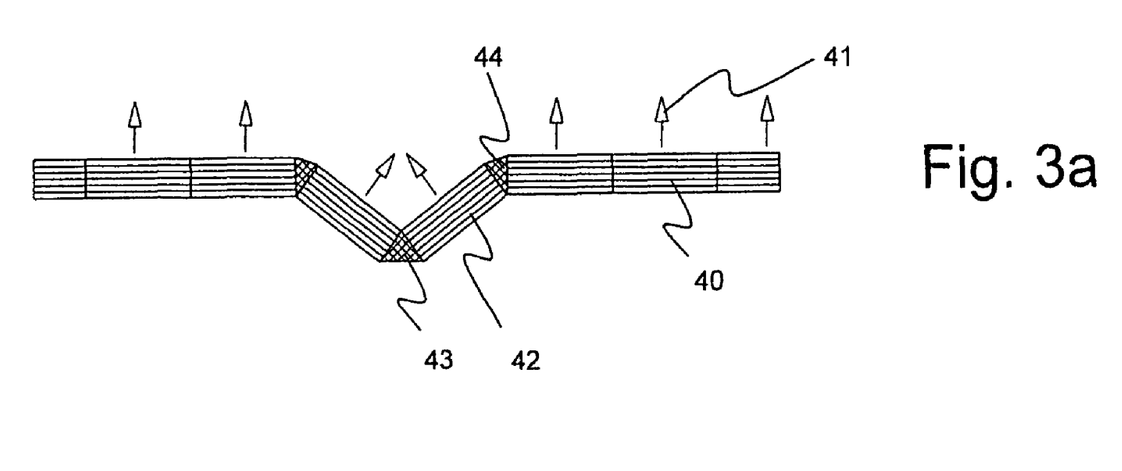
FIG. 3a, 3b shows schematic cross-sectional views of HTS layers of FIG. 1, at different stages of layer growth.
Figure 3B:
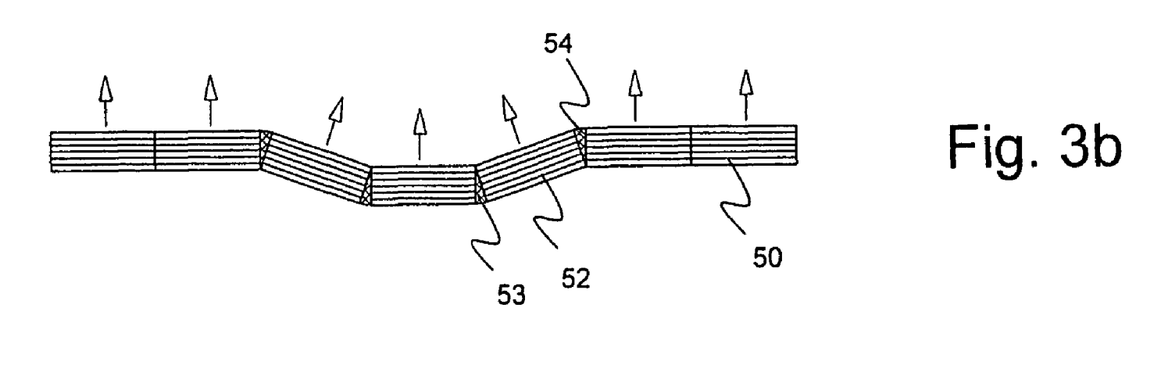

FIGS. 3a and 3b illustrate the stages of growth of the HTS layer (here assumed to be of ReBCO type) on the wavy, closed intermediate layer, around a groove-type roughening structure (see FIG. 1), in accordance with the invention. For simplification, only the HTS layer is shown. The substrate surface is parallel to the horizontal plane.

At an early stage of growth, see FIG. 3a, the roughening structures cause deep, but relatively narrow defects in the HIS layer. In the example shown, the defect comprises two tilted grains 42 (compare the c-axes indicated by arrows 41) and some defect sections 43, 44 at "sticking points" of grains (crystallites) with deviating c-axis orientation, as compared to the substrate plane normal running vertically (not shown). The majority of the grains 40 is oriented in plane with the substrate plane (i.e. with the c-axis perpendicular to the substrate plane; note that the in plane grains 40 may have different rotation positions regarding the c-axis).

At a later stage of growth, see FIG. 3b, the defect smoothes, i.e. it becomes less deep, but wider. The tilted grains 52 have less misorientation of the c-axes as compared to the grains 50 oriented in plane with the substrate plane. Defect sections 53, 54 separate the tilted and non-tilted grains 50, 52. Centrally in the defect, there may be grains with in-plane orientation. When the defect has smoothened too much, it is no more effective in flux pinning, and the roughening should be repeated (see below).

It should be noted that for another material system, the c-axis may be replaced with another specific crystal axis of the HTS layer material.

Figure 4:
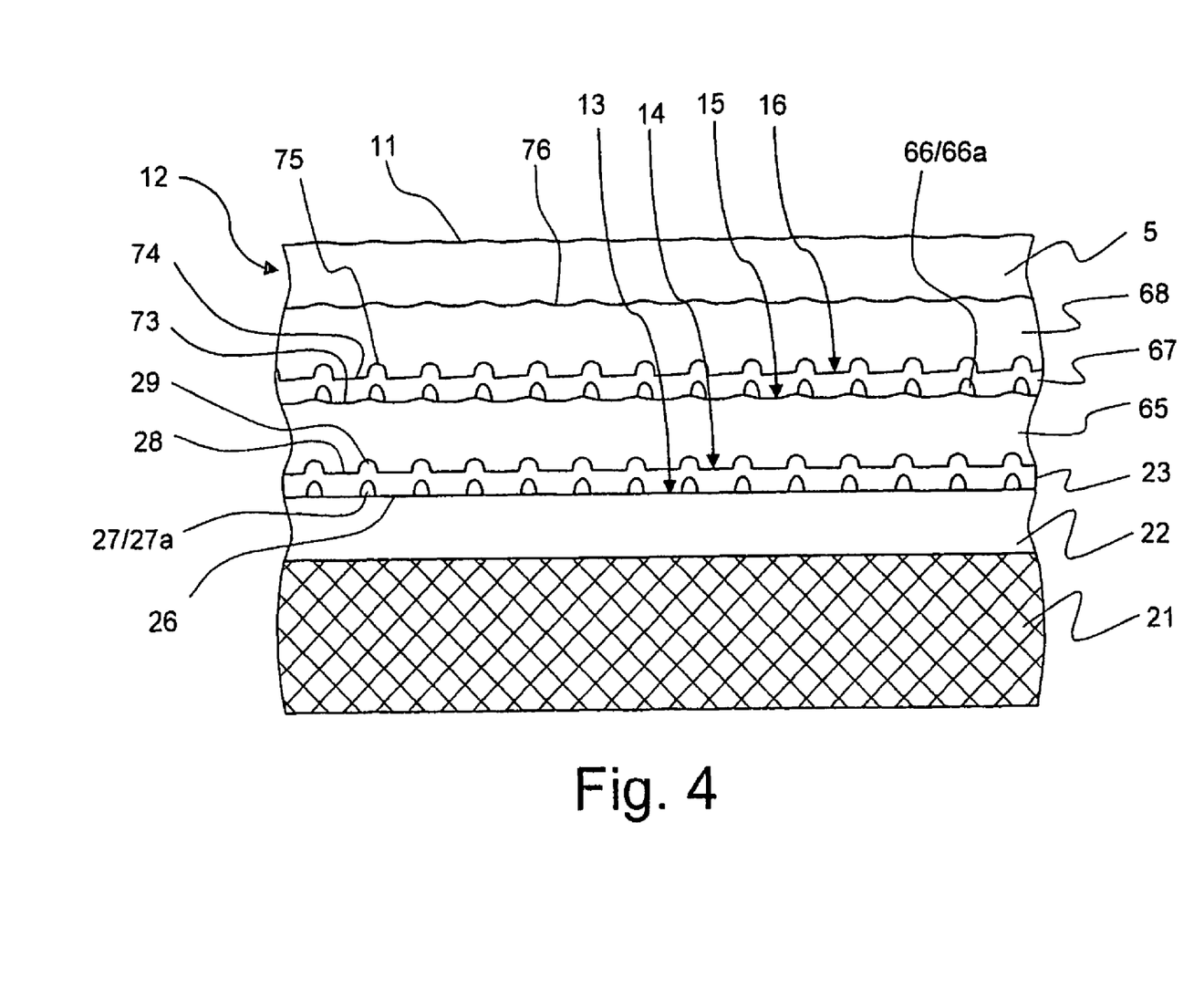
FIG. 4 shows a schematic cross-sectional view of a third embodiment of an inventive HTS coated conductor, comprising two sets of intermediate layer and HTS layer.

FIG. 4 shows a third embodiment of an inventive HTS coated conductor 12. Only the major differences with respect to FIG. 2 are discussed, for simplicity.

The substrate 21, the buffer layer 22, the roughening structures 27 and the intermediate layer 23 correspond to the embodiment shown in FIG. 2. However, the HTS layer 65, which is deposited on top of the intermediate layer 23, has been roughened, resulting in a further roughened surface 15. The roughening of the further roughened surface 15 has been done by depositing material on top of the HTS layer 65, i.e. further roughening structures 66 have been provided, here formed as further local deposits 66a on the surface of the HTS layer 65. It should be noted that the surface of the HTS layer 65 is somewhat wavy anyway, due to the roughened surface 13 (see slightly curved areas 73 between the roughening structures 66), but not wavy enough to guarantee flux pinning above, therefore the roughening was repeated.

A closed further intermediate layer 67 of basically uniform thickness has been deposited on top of the further roughened surface 15 (including the further local deposits 66a). The surface 16 of the further intermediate layer 67 imitates the further roughened surface 15, resulting in reproduced further roughening structures 75 and reproduced further flat areas 74 (the waviness of the slightly curved areas 73 are typically smoothed out in the surface 16).

On top of the surface 16 of the further intermediate layer 67, a further HTS layer 68 has been deposited. Its surface 76 has retained some waviness. On top of the further HTS layer 68, a shunt layer 5 has been deposited.

It should be noted that if desired, the surface 76 of the further HTS layer 68 can be roughened, and a further intermediate layer and a further HTS layer may be deposited on top, and so on. In this way, the current carrying capacity of the HIS coated conductor 12 can be increased.

Figure 5:
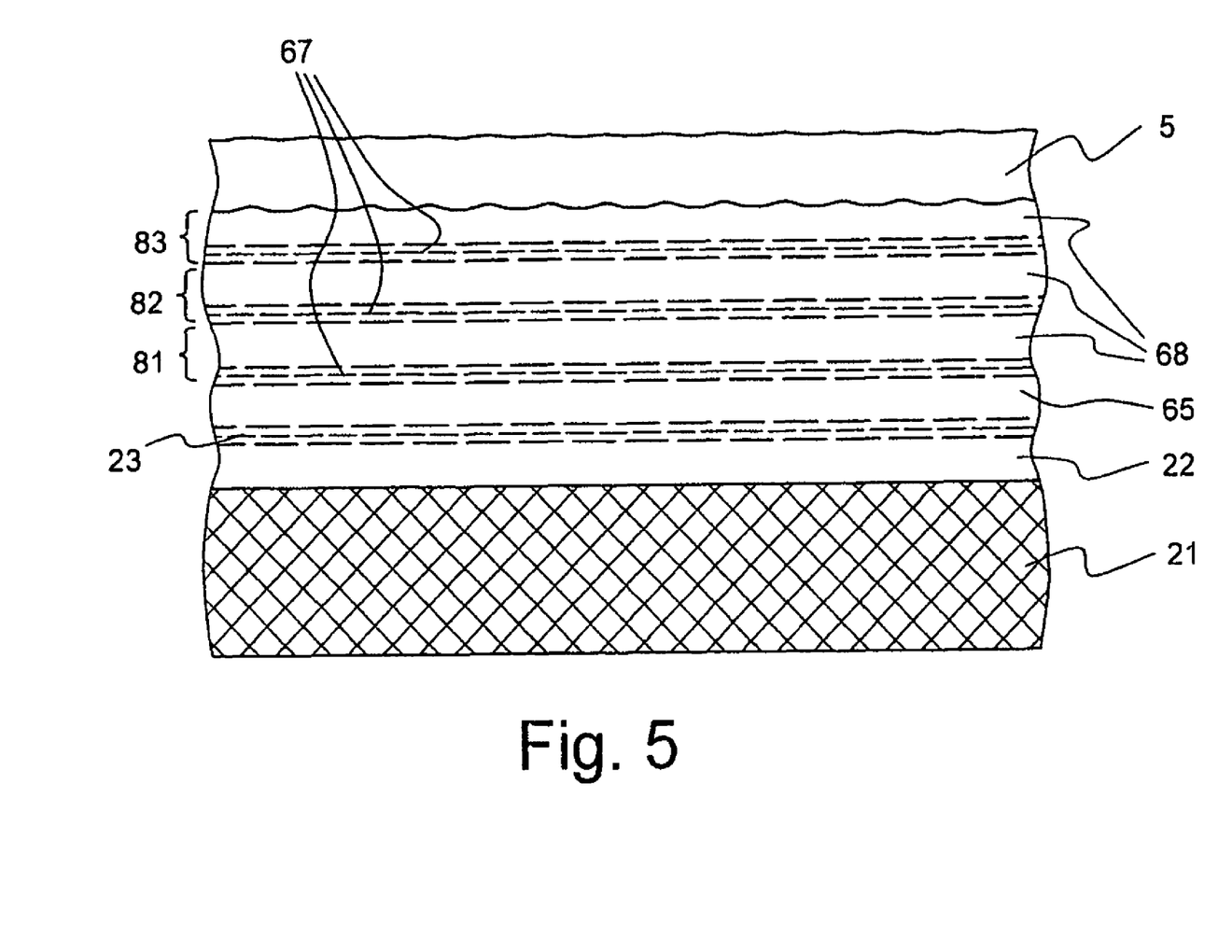
FIG. 5 shows a schematic cross-sectional view of a forth embodiment of an inventive HIS coated conductor, comprising four sets of intermediate layer and HTS layer.

This is illustrated in the forth embodiment of an inventive HTS coated conductor 12 in FIG. 5. Here, three sets 81, 82, 83 of further intermediate layers 67 and further HTS layers 68 have been deposited on top of a (lowest) HTS layer 65, which in turn was deposited on an intermediate layer 23 and a buffer layer 22. The intermediate layer 23 and the further intermediate layers 67 have each been deposited on a roughened surface or a further roughened surface, respectively, in accordance with the invention.

FIGS. 6a-6e illustrate schematically the inventive method of producing a HIS coated conductor 12.

Figure 6A:
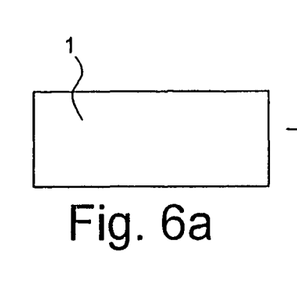
FIG. 6a-6e show a schematic illustration of the inventive method for producing an HTS coated conductor, comparable to the embodiment of FIG. 1.
Figure 6B:
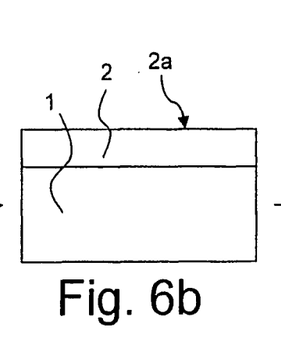

On a basically flat substrate 1, see FIG. 6a, a buffer layer 2 (or a plurality of buffer layers) is deposited, see FIG. 6b. The resulting surface 2a, which is basically flat, undergoes a roughening procedure. In the illustrated example, see FIG. 6c, some buffer layer material is locally removed, so that roughening structures 7 of dent type and flat areas 6 result. On top of this roughened surface 13, an intermediate layer 3 is deposited, see FIG. 6d. Its surface 14 imitates the roughened surface 13. On top of the intermediate layer 3, an HTS layer 4 is deposited, see FIG. 6e. Above the roughening structures 7, the HTS layer 4 exhibits defective areas 4a, which introduce flux pinning in operation of the HTS coated conductor 12, i.e. when electrical current runs through the superconducting HTS layer 4. It is noted that further roughening, intermediate layer deposition and HTS layer deposition steps may follow, in accordance with the invention.

Figure 6C:
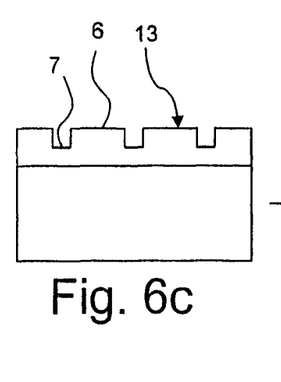
Figure 6D:
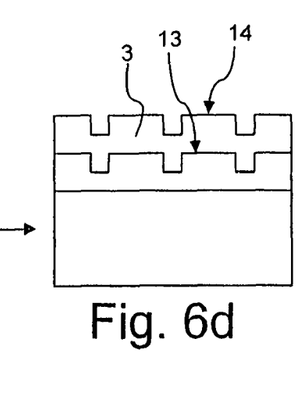
Figure 6E:
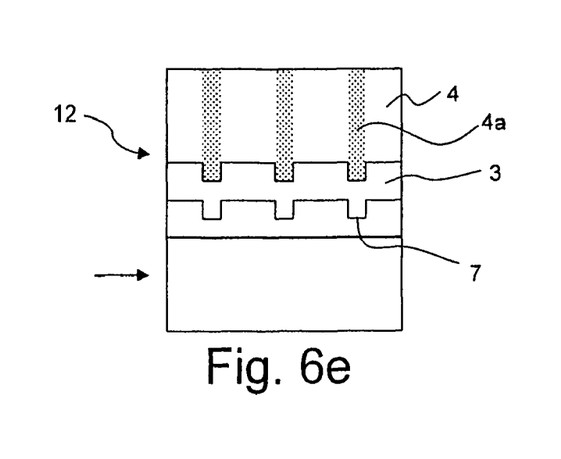
Figure 7:
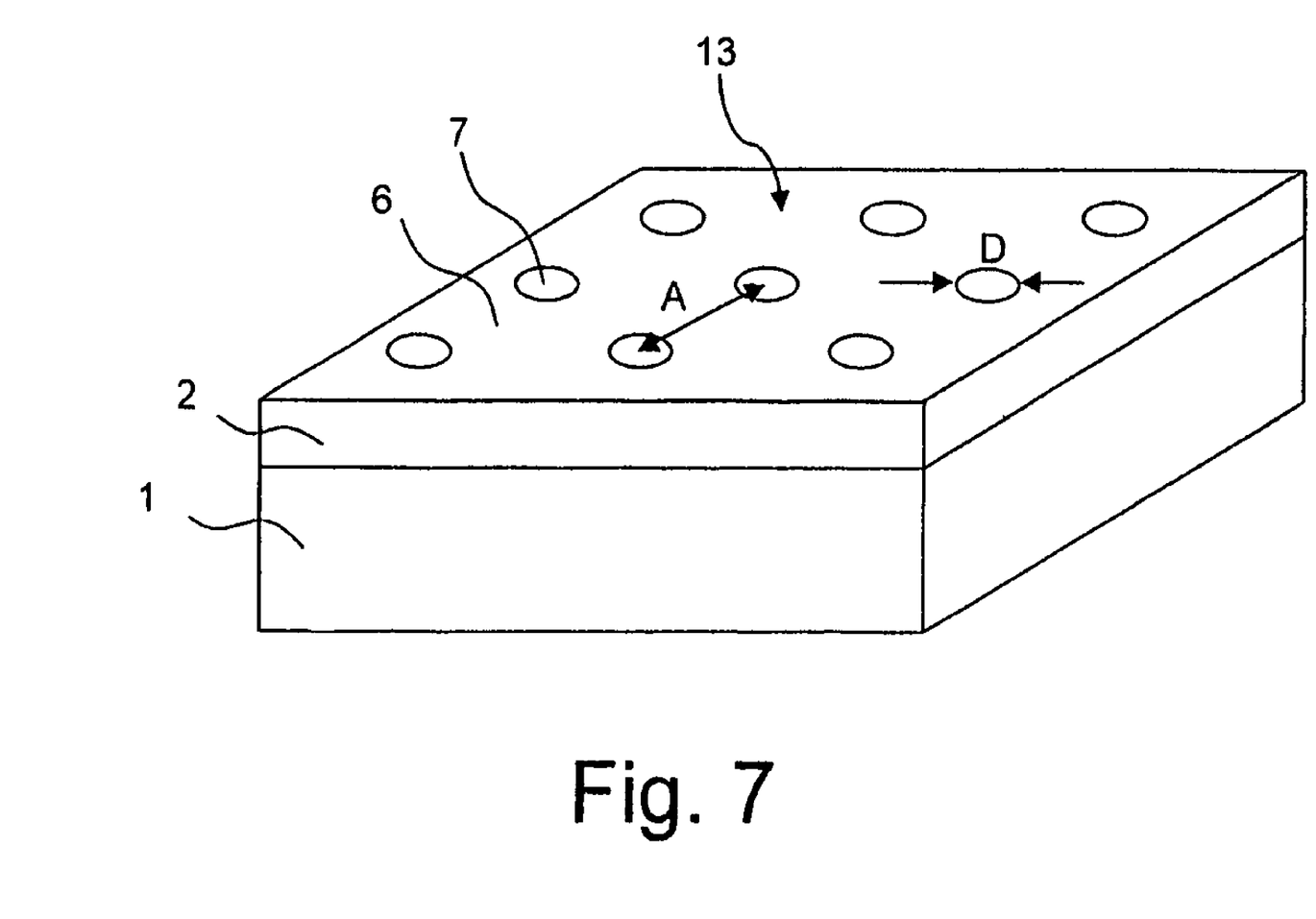
FIG. 7 shows a schematic perspective view of the production stage of FIG. 6c.

FIG. 7 shows a perspective view of the HTS coated conductor production stage of FIG. 6c. Here of the roughened surface 13, about 90% belong to flat (unmachined) area 6, and about 10% belong to roughening structures 7 (here dents). Note that the roughening structures 7 are arranged with a two-dimensional periodicity in the substrate plane here. The average distance A of the roughening structures 7 to their respective next neighbors is here about 25 nm, and the average diameter D of the roughening structures 7 in parallel to the substrate plane is about 5 nm here.

LIST OF REFERENCE SIGNS 1, 21 substrate
2, 22 buffer layer
2a surface of buffer layer
3, 23 intermediate layer 4, 24, 65 HTS layer
4a defective area
5 shunt layer
6, 26 flat area
7, 27 roughened structure
8, 28 reproduced flat area
9, 29 reproduced roughening structure
10 surface of HTS layer
11 surface of shunt layer
12 HTS coated conductor
13 roughened surface
14 surface of intermediate layer
15 further roughened surface
16 surface of further intermediate layer
27a local deposit
40, 50 grain in plain with substrate plain
41 arrow indicating c-axis direction
42, 52 tilted grain
43, 44 defect section
53, 54 defect section
66 further roughening structure
66a further local deposits
67 further intermediate layer
68 further HTS layer
73 further roughened surface
74 reproduced further flat area
75 reproduced further roughening structure
76 surface of further HTS layer
81, 82, 83 set of further intermediate layer and further HTS layer
A average distance
D average diameter

We claim:

1. A method for producing a high temperature superconductor (=HTS) coated conductor, the method comprising the steps of:
    a) selecting a substrate;
    b) depositing a buffer layer on the substrate;
    c) locally roughening, following step b), a surface of the substrate to produce a roughened surface thereof;
    d) depositing, following step c), a non-superconducting, closed intermediate layer on top of the roughened surface; and
    e) depositing, following step d), the HTS layer on top of the intermediate layer.

2. The method of claim 1, wherein, in step c), a first part of the surface area remains flat, and a second part of the surface area is provided with roughening structures, recesses, scratches, dents, grooves, protrusions, humps, islands, walls and/or ridges.

3. The method of claim 2, wherein the first part of the surface area remaining flat is at least 80% or at least 95% and the second part of the surface area provided with roughening structures is less than 20% or less than 5%, of a total surface area of the buffer layer.

4. The method of claim 2, wherein, on average, the roughening structures are spaced apart by between 5 nm and 200 nm.

5. The method of claim 1, wherein, in step c), the roughening of the surface includes locally removing buffer layer material such that, in respective areas, a thickness of the buffer layer is reduced.

6. The method of claim 5, wherein removing of the buffer layer material includes mechanical scratching, etching, selective ion beam etching and/or laser beam etching.

7. The method of claim 1, wherein, in step c), the roughening of the surface includes placing local deposits on top of the buffer layer.

8. The method of claim 7, wherein a material of the local deposits is different from a material of the buffer layer.

9. The method of claim 7, wherein a material of the local deposits is different from a material of the intermediate layer.

10. The method of claim 7, wherein the local deposits are formed as a result of diffusion or of surface diffusion that results in island growth, during or after a deposition process thereof.

11. The method of claim 7, wherein the local deposits are directly placed via depositing particles on the surface of the buffer layer.

12. The method of claim 1, wherein an intermediate layer material and an HTS layer material have a substantially same stoichiometry.

13. The method of claim 1, wherein step c) is performed such that the roughened surface has a one- or two-dimensional periodicity.

14. The method of claim 1, wherein step c) is performed such that the surface roughness of the roughened surface is between 1 nm and 500 nm or between 2 nm and 30 nm.

15. The method of claim 1, further comprising:
    f) roughened a surface of the deposed HTS layer, resulting in a further roughened surface;
    g) depositing a non-superconducting, closed further intermediate layer on top of the further roughened surface; and
    h) depositing a further HTS layer on top of the further intermediate layer.

16. The method of claim 15, wherein steps f) through h) are repeated at least once.

17. An HTS coated conductor comprising
    a substrate;
    a buffer layer or a CeO layer deposited on top of said substrate and having a roughened surface;
    a non-superconducting, closed intermediate layer or CeO intermediate layer deposited on top of said roughened surface of said buffer layer; and
    an HTS layer or a ReBCO type layer deposited on top of said intermediate layer.

18. The HTS coated conductor of claim 17, wherein the HTS coated conductor further comprises a non-superconducting, closed further intermediate layer or further CeO intermediate layer deposited on top of said HTS layer and having a further roughened surface and a further HTS layer or ReBCO type, deposited on top of the further intermediate layer.

19. An HTS coated conductor made by the method of claim 16.

20. The HIS coated conductor of claim 17, wherein said roughened surface and/or one or a plurality of further roughened surfaces have recesses and/or protrusions or protrusions of local deposits.

21. Use of the HTS coated conductor of claim 17, wherein an electric current is transported through said HTS layer and/or one or a plurality of further HTS layers in a superconducting state, wherein magnetic flux lines are pinned at roughening structures of said roughened surface and/or of one or a plurality of further roughened surfaces.

* * * * *